United States Patent
Oden et al.

(10) Patent No.: US 12,339,437 B2
(45) Date of Patent: Jun. 24, 2025

(54) BIAS VOLTAGE ADJUSTMENT FOR A PHASE LIGHT MODULATOR

(71) Applicant: TEXAS INSTRUMENTS INCORPORATED, Dallas, TX (US)

(72) Inventors: Patrick Ian Oden, McKinney, TX (US); James Norman Hall, Parker, TX (US); William C. McDonald, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 401 days.

(21) Appl. No.: 17/120,687

(22) Filed: Dec. 14, 2020

(65) Prior Publication Data

US 2021/0181499 A1   Jun. 17, 2021

Related U.S. Application Data

(60) Provisional application No. 62/947,217, filed on Dec. 12, 2019.

(51) Int. Cl.
| | |
|---|---|
| G02B 26/08 | (2006.01) |
| G02B 26/06 | (2006.01) |
| H02N 1/00 | (2006.01) |

(52) U.S. Cl.
CPC ......... *G02B 26/0841* (2013.01); *G02B 26/06* (2013.01); *H02N 1/006* (2013.01); *B81B 2201/04* (2013.01)

(58) Field of Classification Search
CPC .... G02B 26/0841; G02B 26/06; H02N 1/006; B81B 2201/04

(Continued)

(56) References Cited

U.S. PATENT DOCUMENTS

| | | |
|---|---|---|
| 5,212,582 A | 5/1993 | Nelson |
| 5,312,513 A | 5/1994 | Florence |

(Continued)

FOREIGN PATENT DOCUMENTS

| | | | |
|---|---|---|---|
| CN | 102981272 A | 3/2013 | |
| JP | 2013171219 A | 9/2013 | |
| WO | WO-2009048562 A1 * | 4/2009 | ............. G02B 26/10 |

OTHER PUBLICATIONS

Examiner provided machine translation of Mirror Controller and Mirror Control Method, Shigeru et.al. JP 2008046453) (Year: 2008).*

(Continued)

*Primary Examiner* — Tuyen Tra
*Assistant Examiner* — Rahman Abdur
(74) *Attorney, Agent, or Firm* — Michelle F. Murray; Frank D. Cimino

(57) ABSTRACT

An integrated circuit includes an electrode voltage controller, a micro-electromechanical system (MEMS) structure, and a bias voltage generator. The MEMS structure has a first electrode, a conductive plate, and a reflective layer on the conductive plate. The first electrode is coupled to the electrode voltage controller, and the conductive plate is configured to move vertically with respect to the first electrode responsive to a voltage generated by the electrode voltage controller and applied to the first electrode. The bias voltage generator is coupled to the conductive plate. The bias voltage generator has an input configured to receive a bias control signal. The bias voltage generator is configured to apply a non-zero bias voltage to the conductive plate responsive to the bias control signal.

19 Claims, 11 Drawing Sheets

(58) Field of Classification Search
USPC .................................................... 359/221.2
See application file for complete search history.

(56) References Cited

U.S. PATENT DOCUMENTS

| | | | |
|---|---|---|---|
| 5,606,441 | A | 2/1997 | Florence et al. |
| 5,614,921 | A | 3/1997 | Conner et al. |
| 5,719,695 | A | 2/1998 | Heimbuch |
| 6,028,689 | A | 2/2000 | Michalicek |
| 6,329,738 | B1 | 12/2001 | Hung et al. |
| 6,501,588 | B1 | 12/2002 | Rosa et al. |
| 6,542,282 | B2 | 4/2003 | Smith et al. |
| 6,625,343 | B2 | 9/2003 | Kato |
| 6,695,457 | B2 | 2/2004 | Drieenhuizen |
| 6,856,448 | B2 | 2/2005 | Fitzpatrick |
| 6,867,897 | B2 | 3/2005 | Patel et al. |
| 6,897,991 | B2 | 5/2005 | Huffman et al. |
| 7,106,491 | B2 | 9/2006 | Meyer et al. |
| 7,477,440 | B1 | 1/2009 | Huang |
| 7,977,897 | B2 | 7/2011 | Schenk |
| 10,371,939 | B2 | 8/2019 | McDonald |
| 10,831,018 | B2 | 11/2020 | Fruehling et al. |
| 2002/0057484 | A1 | 5/2002 | Mori |
| 2002/0181110 | A1* | 12/2002 | Bower ............... B81C 1/00666 359/838 |
| 2003/0168928 | A1 | 9/2003 | Clark et al. |
| 2004/0008396 | A1* | 1/2004 | Stappaerts ......... G02B 26/0841 359/245 |
| 2004/0160118 | A1 | 8/2004 | Knollenberg et al. |
| 2004/0179257 | A1* | 9/2004 | Gurcan ............ G02B 26/0841 359/290 |
| 2004/0248417 | A1 | 12/2004 | Malone |
| 2005/0180686 | A1 | 8/2005 | Patel et al. |
| 2005/0185250 | A1 | 8/2005 | Novotny et al. |
| 2006/0023994 | A1 | 2/2006 | Ko et al. |
| 2006/0119922 | A1 | 6/2006 | Faase et al. |
| 2007/0053052 | A1 | 3/2007 | Pan |
| 2007/0101398 | A1* | 5/2007 | Islam ................. G02B 26/0808 725/151 |
| 2007/0146376 | A1 | 6/2007 | Miles |
| 2008/0013145 | A1 | 1/2008 | Chui et al. |
| 2008/0122822 | A1 | 5/2008 | Pan et al. |
| 2009/0079362 | A1* | 3/2009 | Shteynberg ............ H05B 45/24 315/294 |
| 2009/0128888 | A1 | 5/2009 | Ichikawa et al. |
| 2010/0067094 | A1 | 3/2010 | Sugimoto et al. |
| 2010/0232623 | A1* | 9/2010 | Martin ................. H04R 29/001 381/96 |
| 2012/0126333 | A1* | 5/2012 | Thomas ............. H01L 27/1203 257/369 |
| 2012/0198934 | A1* | 8/2012 | Cardarelli ............. G01P 21/00 73/504.02 |
| 2012/0236042 | A1* | 9/2012 | Parmar ............... G09G 3/3466 345/690 |
| 2013/0136267 | A1* | 5/2013 | Hammerschmidt . H04R 19/005 381/111 |
| 2013/0147567 | A1* | 6/2013 | Yamakawa ............ H03L 1/027 331/154 |
| 2013/0278912 | A1* | 10/2013 | Owa ................... G02B 27/425 355/71 |
| 2013/0298670 | A1* | 11/2013 | Tsugai ................. G01C 19/56 73/504.12 |
| 2016/0203770 | A1 | 7/2016 | Yoshizawa |
| 2017/0003392 | A1 | 1/2017 | Bartlett et al. |
| 2017/0318385 | A1* | 11/2017 | Harney ................. H04R 19/04 |
| 2017/0328989 | A1 | 11/2017 | Bartlett |
| 2019/0179134 | A1 | 6/2019 | Fruehling et al. |
| 2019/0356282 | A1* | 11/2019 | Froehlich ................. H03F 1/34 |
| 2020/0159005 | A1* | 5/2020 | Druml ................... G01S 7/4817 |
| 2020/0209614 | A1 | 7/2020 | McDonald et al. |

OTHER PUBLICATIONS

Non-Final Office Action dated Sep. 16, 2022, U.S. Appl. No. 17/093,277, 21 pages.

R.W. Gerchberg and W.O.Saxton, "A Practical Algorithm for the Determination of Phase From Image and Diffraction Plane Pictures", Optik, vol. 35, No. 2, (1972), retrieved Oct. 14, 2019 from the uniform resource locator, pp. 1-6 (URL):https://antoine.wojdyla.fr/assets/archive/gerchberg_saxton1972.pdf.

Bifano, Thomas et al., "Large-scale metal MEMS mirror arrays with integrated electronics", Design, Test, Integration and Packaging of MEMS/MOEMS 2002, Proceedings of the SPIE, vol. 4755, pp. 467-746, 2002; retrieved Oct. 15, 2019 from the uniform resource locator (URL): http://people.bu.edu/tgb/PDF_files/17_DTIPSLM.pdf.

Bartlett, Terry et al., "Adapting Texas Instruments (TI) DLP technology to demonstrate a phase spatial light modulator", Emerging Digital Micromirror Device Based Systems and Applications XI, Proceedings of the SPIE, vol. 10932 (Mar. 4, 2019), 13 pages.

Search Report for PCT Patent Application No. PCT/US2020/064897, date of mailing of the international search report Mar. 18, 2021, 1 page.

Extended Search Report for European Patent Application No. EP18885789.0, mailed Feb. 17, 2021, 1 page.

Cn102981272a, Machine English Translation, 14 pages.

Non-Final Office Action dated Jul. 19, 2023, U.S. Appl. No. 17/093,277, filed Nov. 9, 2020, 8 pages.

"Adapting Texas Instruments (TI) DLP Technology to Demonstrate a Phase Spatial Light Modulator," Proceedings of SPIE, vol. 10932, 109320S-1, 2019 SPIE, 13 pages.

Notification of First Office Action mailed Jul. 21, 2023, Chinese Application No. 202080069718X, 18 pages.

Non-Final Office Action dated Aug. 2, 2023, U.S. Appl. No. 16/653,026, 18 pages.

Non-Final Office Action mailed Dec. 7, 2022, U.S. Appl. No. 16/653,026, filed Oct. 15, 2019, 30 pages.

* cited by examiner

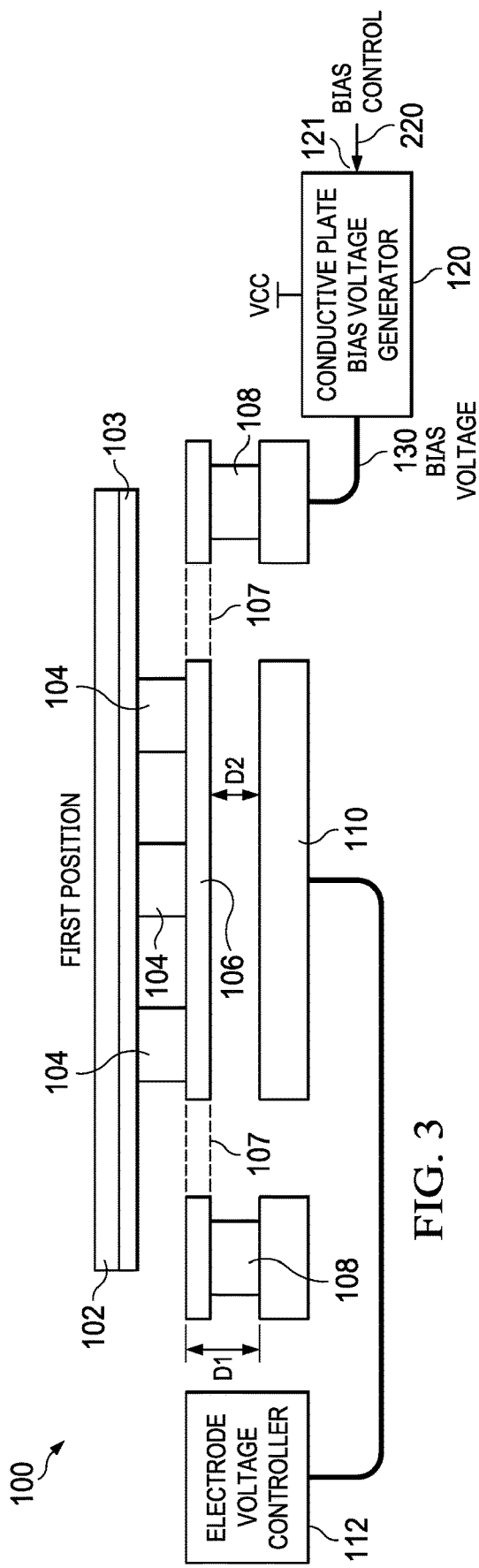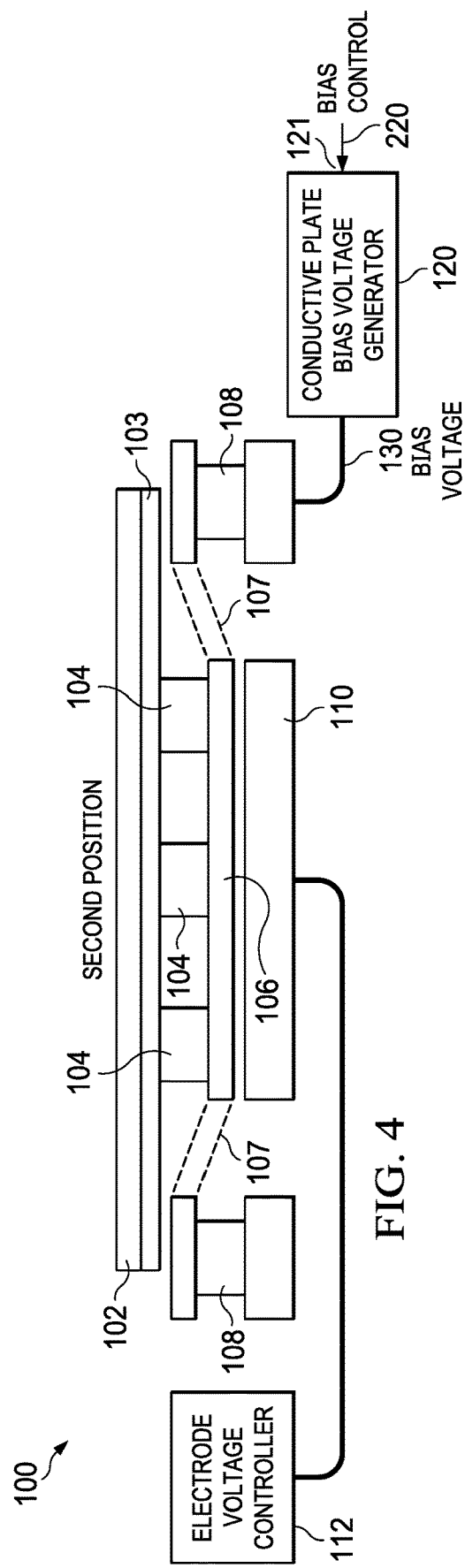

700

| COLOR | BINARY VALUE | BIAS VOLTAGE |
|---|---|---|
| RED | 00 | 0.1V |
| GREEN | 01 | 0.2V |
| BLUE | 10 | 0.3V |

800

| COLOR | BIAS CONTROL | BIAS VOLTAGE |
|---|---|---|
| RED | 00 | 0.1V |
| ΔV | 01<br>10 | 0.1V |

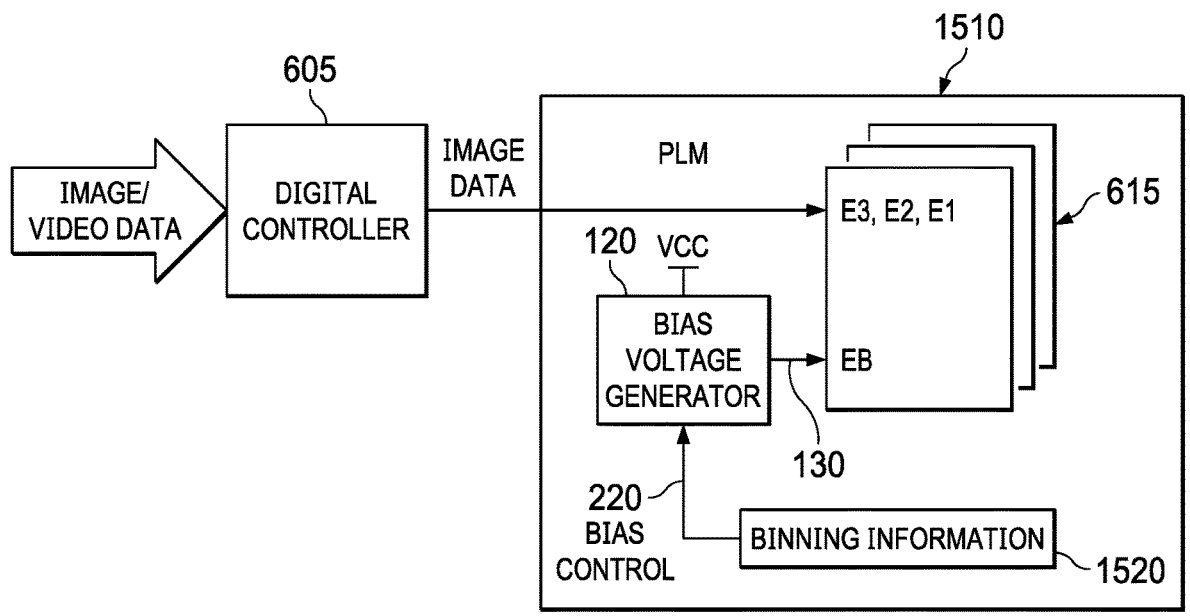
FIG. 15
| LUT | PULL-IN | BIAS VOLTAGE |
|---|---|---|
| 00 | 10V | 0 |
| 01 | 9.5V | 0.5 |
| 10 | 9V | 1.0 |
| 11 | 8.5V | 1.5 |
FIG. 16
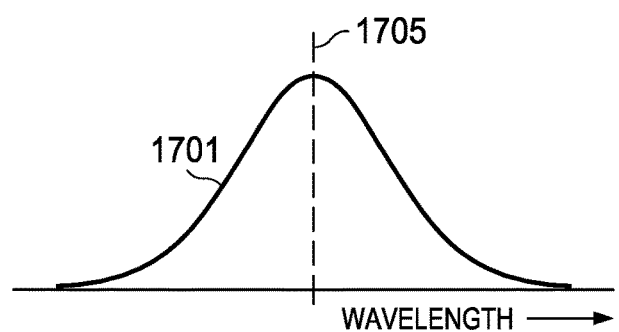
FIG. 17A

BIAS VOLTAGE ADJUSTMENT FOR A PHASE LIGHT MODULATOR

CROSS-REFERENCE TO RELATED APPLICATIONS

This application claims priority to U.S. Provisional Application No. 62/947,217, filed Dec. 12, 2019, which is hereby incorporated by reference.

BACKGROUND

Actuators (e.g., electrostatic and non-electrostatic) are used in various technologies. For example, actuators may be used in phase light modulators (PLMs) to modulate the phase of light. Phase light modulators can be implemented as microelectromechanical systems (MEMS) that include an array of mirrors. Incident light beams reflect off the mirrors. The MEMS mirrors can be independently, vertically moved to vary the phase of the incident light beam. Each mirror may represent a pixel. Each pixel in such microelectromechanical actuator systems includes a base electrode as well as a spring electrode coupled to the mirror. When a voltage differential is created between the base electrode and the spring electrode, the spring electrode moves towards the base electrode, thereby moving the mirror to a different position. Such microelectromechanical system phase light modulators are used in a variety of applications such as high dynamic range cinema, light detection and ranging systems, high volume optical switching (e.g., used in telecom or server farms), microscopy/spectroscopy/adaptive optics (e.g., used in astronomy, ophthalmology, machine vision, etc.), and holographic displays.

SUMMARY

In one example, an integrated circuit includes an electrode voltage controller, a micro-electromechanical system (MEMS) structure, and a bias voltage generator. The MEMS structure has a first electrode, a conductive plate, and a reflective layer on the conductive plate. The first electrode is coupled to the electrode voltage controller, and the conductive plate is configured to move vertically with respect to the first electrode responsive to a voltage generated by the electrode voltage controller and applied to the first electrode. The bias voltage generator is coupled to the conductive plate. The bias voltage generator has an input configured to receive a bias control signal. The bias voltage generator is configured to apply a non-zero bias voltage to the conductive plate responsive to the bias control signal.

BRIEF DESCRIPTION OF THE DRAWINGS

FIGS. 3 and 4 illustrate two different vertical positions of a mirror within a phase light modulator.

FIGS. 15-16 illustrate an example in which the bias voltage generator adjusts the bias voltage of the PLM for binning control.

FIGS. 17A and 17B illustrates an example in which the bias voltage generator adjusts the bias voltage of the PLM for modulation over wide bandwidth illumination sources.

DETAILED DESCRIPTION

Figure 1:
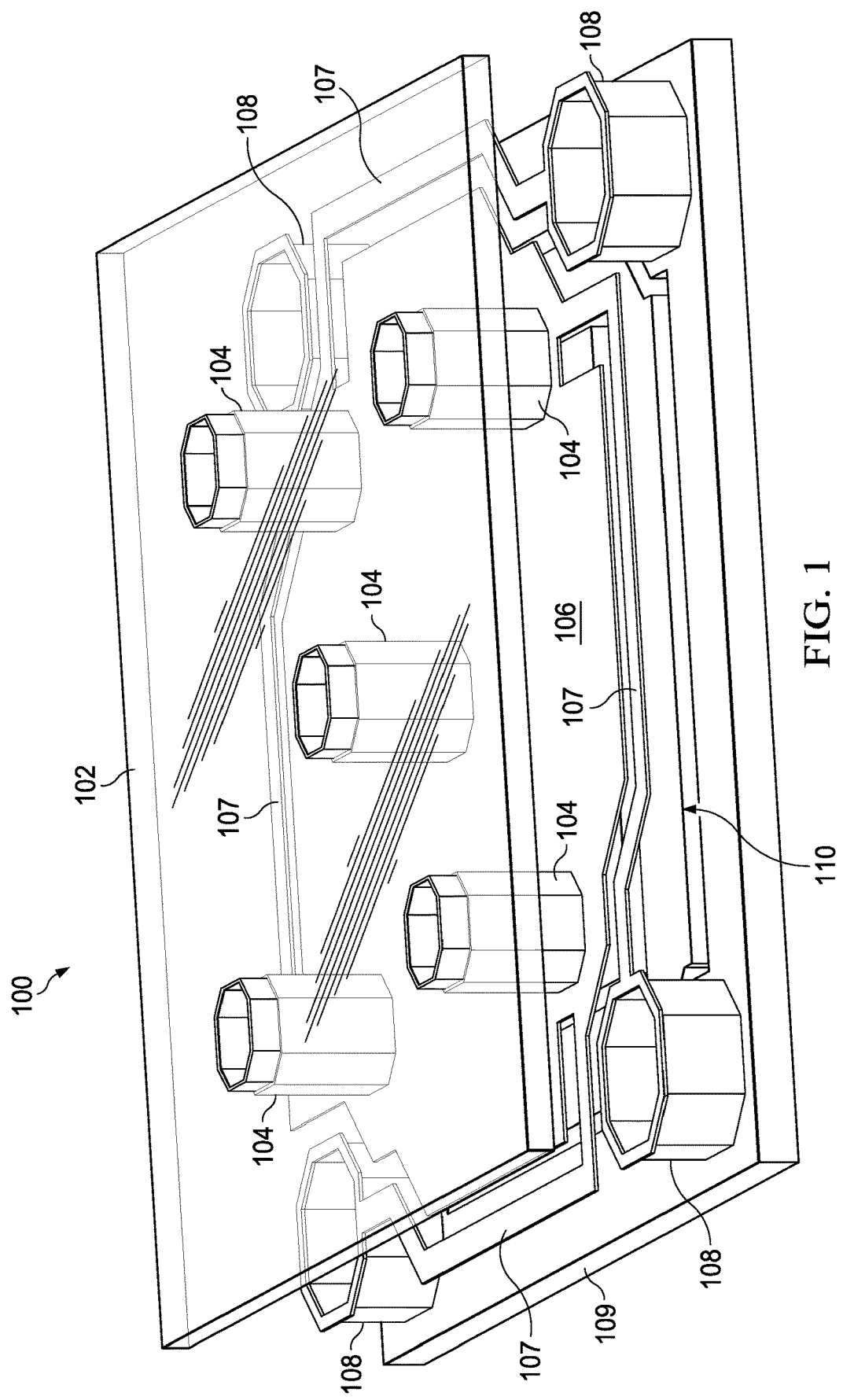
FIG. 1 shows an example of a phase light modulator having a mirror plate that moves vertically with respect to an electrode as a function of an applied voltage to the electrode.

As described above, to modulate a beam of light, a phase light modulator (PLM) includes mirrors that can be adjusted (e.g., moved or displaced) in order to change the properties (e.g., phase) of a reflected beam of light. In some examples, spatial light modulators use actuators to move the mirrors responsive to applied voltages. In some examples, PLMs use microelectromechanical systems (MEMS)-based actuators to move the mirrors based on a combination of an electrostatic force and a spring force.

A parallel-plate, electrostatic actuator (e.g., used in a MEMS) is a device that utilizes electrostatic force to move an object (e.g., a mirror of a phase light modulator pixel). For example, the actuator includes a movable conductive plate that supports a mirror. The conductive plate is also anchored to an attachment at a distance d from a fixed electrode. The conductive plate includes one or more flexural arms attached to support posts. The flexural arms function as a spring (having a spring constant, k) and contribute to a spring constant, k (stiffness). The conductive plate and the electrode are parallel to each other, and a potential difference is applied between the electrode to force them nearer together or farther apart, hence the name "parallel-plate actuator."

Responsive to an applied potential difference (which creates an electrostatic force) between the electrode and the conductive plate relative to the spring implemented by the conductive plate and its flexural arms, the conductive plate moves towards (or away from) the electrode. Usually, the conductive plate is coupled to ground, and the electrode is coupled to a voltage regulator. The voltage regulator applies a variable voltage to the electrode. When the voltage applied to the electrode increases, the voltage differential between the electrode and the conductive plate generates an electrostatic force that drives the conductive plate towards the electrode, thereby moving the mirror (which is supported on the conductive plate) toward the second electrode.

Alternatively, the electrode may be implemented as a digital electrode having multiple conductive portions, each capable of separately receiving a particular voltage. Accordingly, the combined surface area of the conductive portions subject to an applied voltage can vary. As the amount of area of the digital electrode receiving the applied voltage increases, the electrostatic force also increases resulting in the conductive plate being pulled nearer digital electrode. As the voltage decreases (and/or the amount of area applying the voltage on the digital electrode decreases), the electrostatic force decreases resulting in the conductive plate moving away from the digital electrode (e.g., due to the mechanical force of the flexural arms). In this manner, a controller can control the voltage and/or amount of area receiving a voltage on the digital electrode to control the position of the conductive plate, thereby controlling the position of the mirror. The amount of travel of a mirror corresponds to an achievable phase modulation of the PLM.

The term "electrode" as used herein may refer to a single conductive element that can receive a variable voltage. The term "electrode" also may refer to a digital electrode having multiple conductive area portions, each of which individually receives a particular voltage.

FIG. 1 shows a three-dimensional view of a MEMS structure 100 for a single element of a phase light modulator. An integrated circuit may have an array of such MEMS structures 100 to form the phase light modulator. As shown in the example of FIG. 1, the MEMS structure 100 includes electrode 110, conductive plate 106, a mirror 102, and support posts 108. The support posts 108 are electrically conductive (e.g., metal) and extend upward from a metal structure 109 (sometimes referred to as the bottom metal). MEMS structure 108 includes four support posts 108. The conductive plate 106 is generally square but can have any suitable shape. The conductive plate 106 includes one or more (four in the example of FIG. 1) flexural arms 107. The flexural arms 107 of the conductive plate 106 have a mechanical spring constant. When stretched, the flexural arms 107 apply a mechanical force in the opposite direction of the stretching. The flexural arms 107 are attached to the support posts 108. The support posts 108, flexural arms 107, and conductive plate 106 are all formed of an electrically conductive material (e.g., a metal) and coupled together (or formed as a unitary set of components). Accordingly, the conductive plate 106 will be at the same potential as the support posts 108.

The mirror 102 is a reflective layer and is supported above the conductive plate 106 by one or more mirror attachments 104. Each mirror attachment 104 may be a via formed within the MEMS structure. A support plate (not shown in FIG. 1) may be disposed between the mirror attachments 104 and the mirror 102. Accordingly, the mirror 102 is supported by the support plate, and the support plate is supported by the mirror attachments 104. In some examples, a different object may be included in place of the mirror 102.

Figure 2:
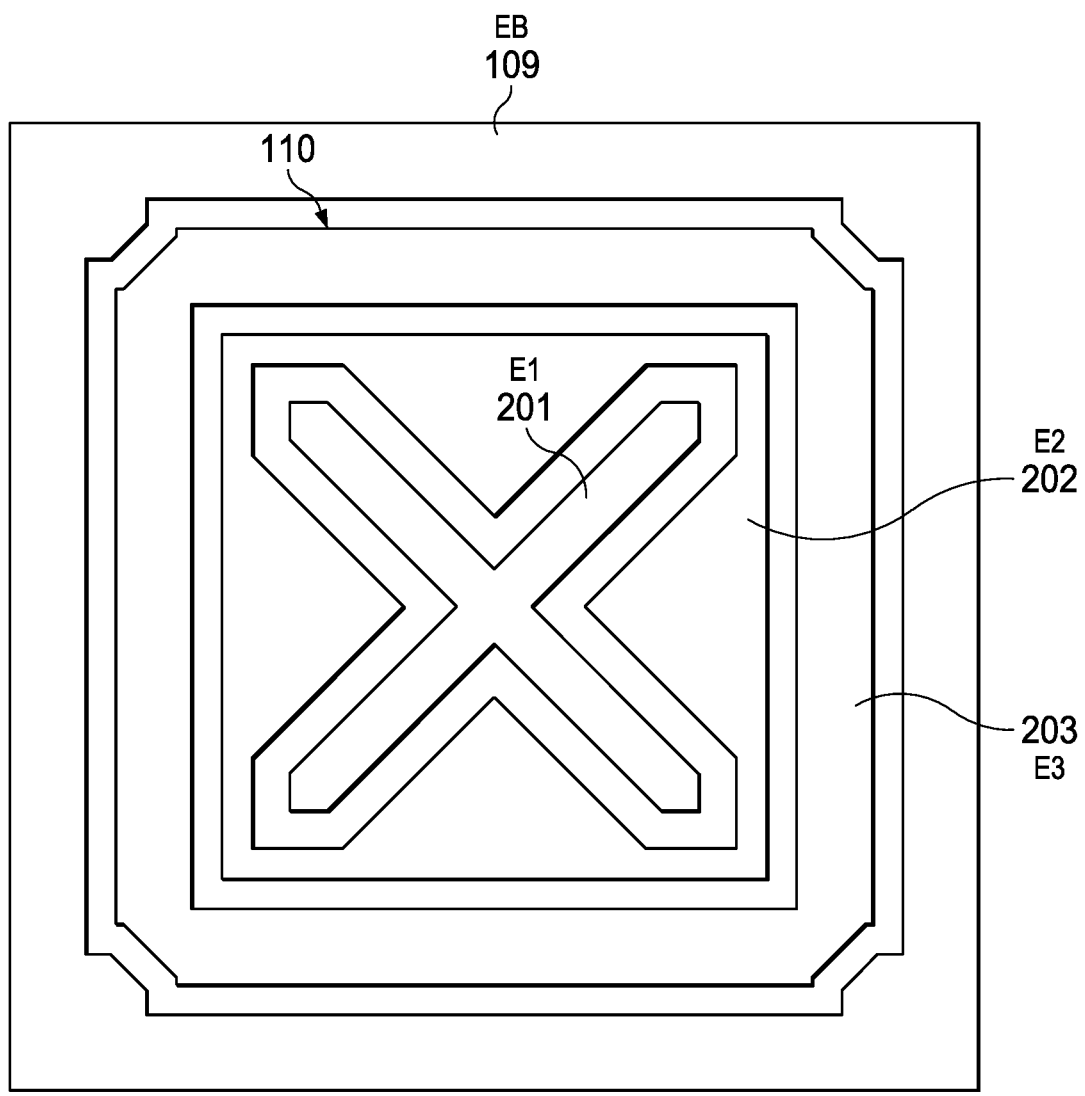
FIG. 2 shows an example implementation of the electrode.

FIG. 2 shows an example of electrode 110 within metal structure 109. The electrode 110 and the metal structure 109 may be formed from the same metal layer which is etched to the form the structures shown in FIG. 2. The electrode 110 in this example is a digital electrode including an inner electrode portion (E1) 201, a middle electrode portion (E2) 202, and an outer electrode portion (E3) 203. While three electrodes forming the digital electrode 110 are shown in this implementation, any suitable number of electrodes may be included.

FIGS. 3 and 4 illustrate the mirror at two different vertical positions relative to the conductive plate 106. An electrode voltage controller 112 is shown coupled to electrode 110. FIG. 3 illustrates the vertical position of the conductive plate 106 (and thus mirror 102 and support plate 104) with the voltage on electrode 110 from the electrode voltage controller 112 at a voltage level that is smaller than the voltage on electrode 110 in FIG. 4. Because the electrode voltage is larger in FIG. 4 than in FIG. 3, the conductive plate 106 is nearer the electrode 110 in FIG. 4 than in FIG. 3.

Although FIGS. 3 and 4 illustrate two positions for the conductive plate 106 relative to the electrode 110, the potential difference applied between the conductive plate 106 and the electrode 110 can be varied to cause the conductive plate 106 to be at any of multiple (two, three, four, or more) different positions relative to the electrode 110. In the example of FIG. 2, with electrode 110 including three electrode portions 201-203 and each electrode portion receiving either ground or a fixed voltage, eight different electrode configurations are possible and thus eight different separation distances between the conductive plate 106 and the electrode 110 are possible.

As described above, for some phase light modulators, the support posts 108 is connected to electrical ground. Consequently, the conductive plate 106 also is grounded. However, various benefits can be realized if the conductive plate receives a bias voltage other than ground. To that end, FIGS. 3 and 4 illustrate that the integrated circuit containing the MEMS structure 100 also includes conductive plate bias voltage generator 120 (also referred to as a bias voltage generator). The bias voltage generator 120 includes an input 121 which can receive a bias control signal 220. The bias voltage generator 120 generates a bias voltage 130 based on information encoded in the bias control signal 220. In one example, the bias voltage 130 is a direct current (DC) voltage having a magnitude based on the bias control signal 220. In other examples, the bias voltage 130 is a time varying voltage having a magnitude and/or frequency based on the bias control signal 220.

Figure 5:
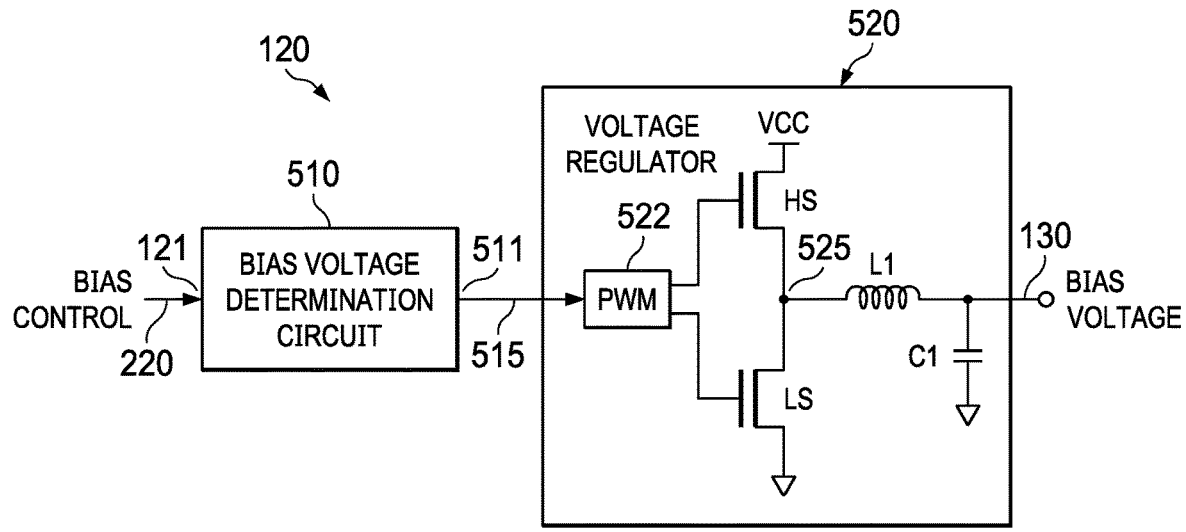
FIG. 5 shows an example of a bias voltage generator usable in the phase light modulator.

FIG. 5 shows an example implementation of the bias voltage generator 120. In this example, the bias voltage generator 120 includes a bias voltage determination circuit 510 coupled to a voltage regulator 520. The bias voltage determination circuit 510 includes the input 121 that receives the bias control signal 220. An output 511 of the bias voltage determination circuit 510 is coupled to the voltage regulator 520. The voltage regulator 520 includes a pulse width modulator (PWM) 522, a high side (HS) transistor, a low side (LS) transistor, an inductor L1, and a capacitor C1. The HS transistor couples to the LS transistor at a switch node 525. One terminal of the inductor L1 couples to the switch node 525, and the capacitor C1 couples to the other terminal of the inductor L1. The connection point between the inductor L1 and the capacitor C1 is the output of the voltage regulator 520 and provides the bias voltage 130. The voltage regulator 520 in FIG. 5 is implemented as a switching regulator and specifically a buck converter. However, the voltage regulator 520 can be implemented as other types of switching regulators, linear (non-switching) regulators, or any suitable type of circuit that produces a certain bias voltage 130 responsive to the bias control signal 220 received by the bias voltage determination circuit 510. In one example, bias voltage generator 120 is implemented as a digital-to-analog converter (DAC), which generates an analog output voltage based on the digital bias control signal 220. The DAC's analog output voltage would be the bias voltage 130.

The PWM 522 reciprocally toggles on and off the HS and LS transistors to produce a square wave on the switch node 525, and through the inductor L1 and capacitor C1 results in a regulated bias voltage 130. The magnitude of the bias voltage 130 is a function of the magnitude of VCC and the duty cycle implemented by the PWM's control of the HS and LS transistors. Thus, by varying the duty cycle implemented by the PWM 522, the magnitude of the bias voltage 130 can be varied. The bias voltage determination circuit 510 generates a control signal 515 to the PWM 522. Control signal 515 informs the PWM 522 about the duty cycle to be implemented by the PWM 522 and thus the magnitude of the bias voltage 130. In other implementations, the control signal 515 may specify the on/off time for either or both of the HS and LS transistors.

Figure 6:
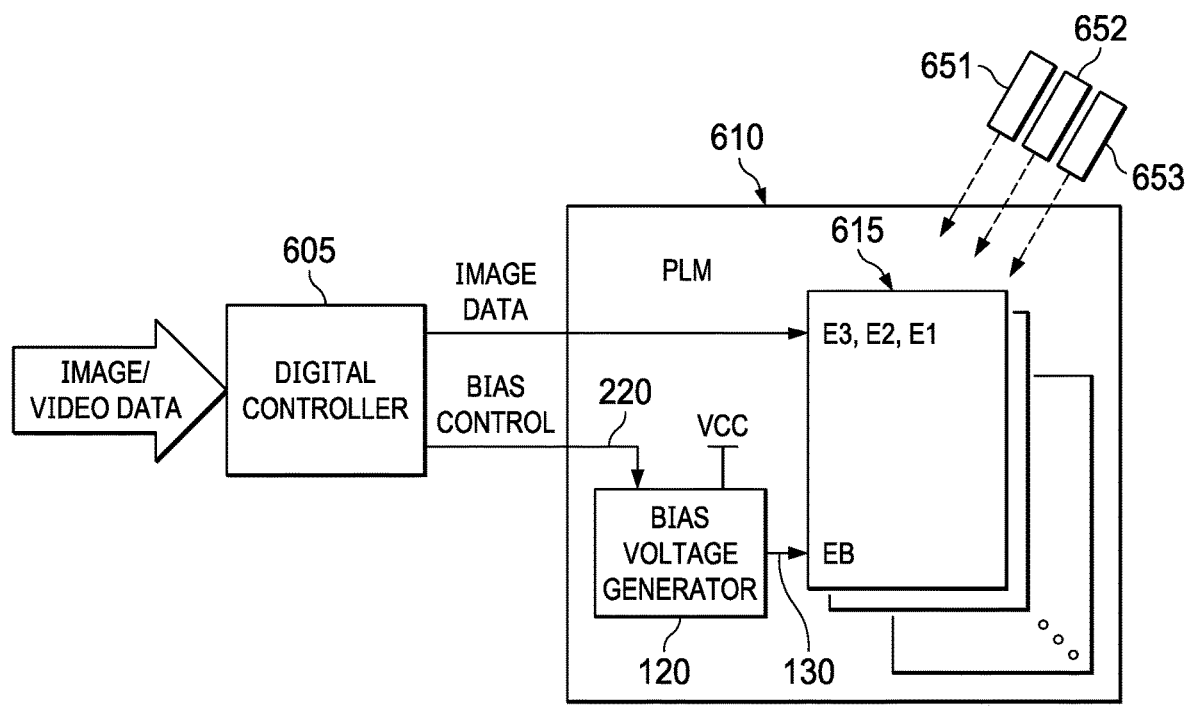
FIGS. 6-8 illustrate an example in which the bias voltage generator adjusts the bias voltage of the PLM for wavelength control.

FIG. 6 shows an example of a PLM 610 comprising multiple PLM elements 615 arranged in, for example, an array. A digital controller 605 is coupled to the PLM 610. Each PLM element 615 may comprise the MEMS structure 100 described above. An array of such MEMS structures 100 may be implemented on a semiconductor die comprising the PLM 610. The voltage on the electrode 110 of a given PLM element 615 may be the same or different as the voltage on another PLM element 615. The PLM elements 615 on the PLM 610 are individually addressable. In one example, three primary colors (e.g., red, green, blue) are sequentially shined (e.g., directed or projected) on the mirrors 102 of the PLM elements 615 at a rate fast enough that the human eye integrates the sequence of colors into one target color. FIG. 6 shows three light sources 651, 652, and 653. In one example, the light source sources comprise laser diodes (e.g., light source 651 is a red laser diode, light source 652 is a green laser diode, and light source 653 is a blue laser diode). The light sources 651-653 may be sequenced with only one of the light sources active at any point in time. Other examples may include more than three light sources, for example, multiple laser diodes within the wavelength band generally corresponding to red, multiple laser diodes within the wavelength band generally corresponding to green, and multiple laser diodes within the wavelength band generally corresponding to blue. In another example, multiple PLMs 610 may be provided—one per the three primary colors.

The digital controller 605 provides image data 606 to the PLM 610. The image data 606 comprises values that indicate the voltage to generated by the electrode 110 of each PLM element 615. In the example of FIG. 6, the PLM 610 also implements wavelength control by biasing the conductive plate 106 of each PLM element 615 can be biased to a certain voltage based on the wavelength of light provided to the PLM elements 615. The digital controller 605 provides the bias control signal 220 to the bias voltage generator 120. The bias control signal 220 in this example includes a value indicative of the color of light shined on the PLM 610. The three primary colors have different wavelengths and thus different half wavelengths. By adjusting the bias voltage differently for the three wavelengths, the displacement between the electrode 110 and the conductive plate 106 can be tuned independently for each color wavelength.

Figures 7, 8, 9:
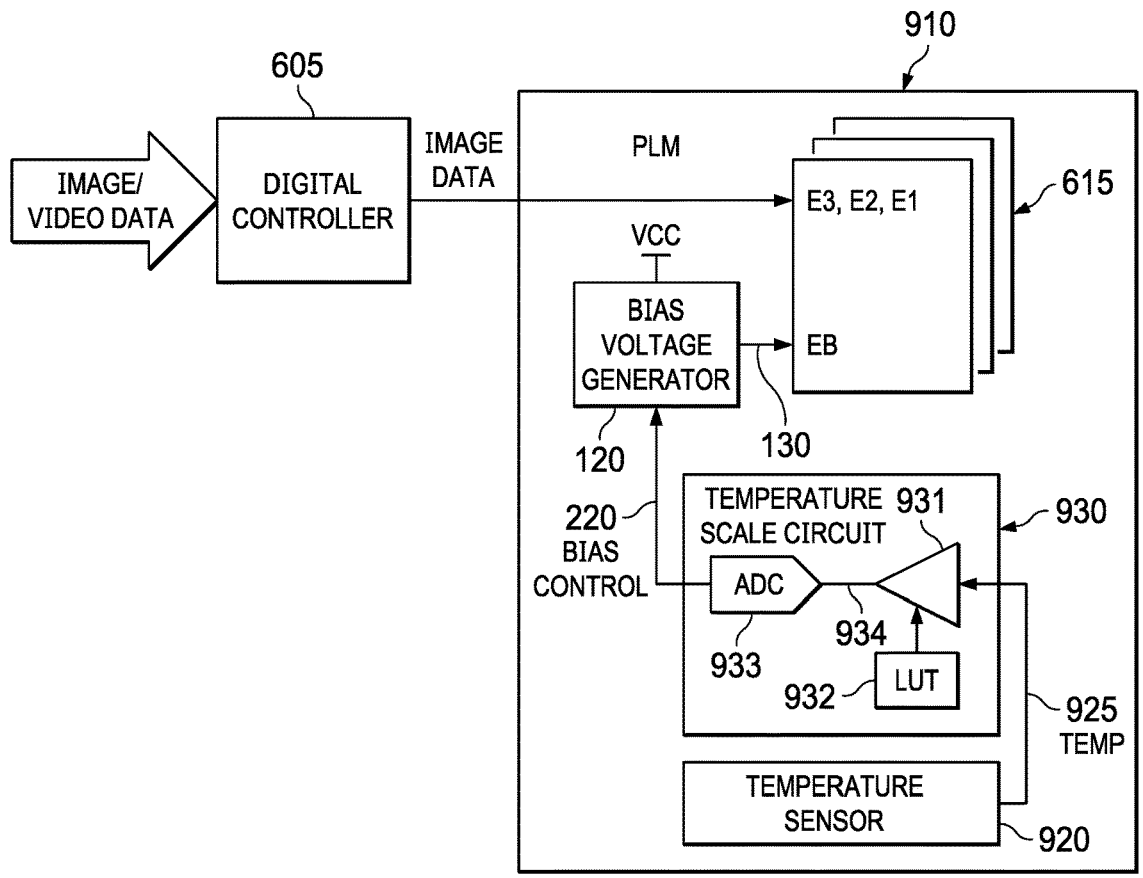
FIG. 9 illustrates an example in which the bias voltage generator adjusts the bias voltage of the PLM for temperature compensation.

The PLM 610 also includes a bias voltage generator 120 implemented, for example, in accordance with the hinge plate bias voltage generator 120 shown in FIG. 5. In one example, the bias voltage determination circuit 510 of FIG. 5 is implemented as a hardware look-up table (LUT) in FIG. 6 (or any suitable type of storage element), examples of which are shown in FIGS. 7 and 8. The LUT 700 of FIG. 7 includes a value 705 indicative of a target bias voltage for each color (e.g., 0.1V for red, 0.2V for green, and 0.3V for blue). The bias control signal 220 may include a two-bit binary value 704 which indicates which of the three primary colors is shined onto the PLM 610 at any point in time. In the example of FIG. 7, '00' designates red, '01' designates green, and '10' designates blue. The bias voltage determination circuit 510 accesses the LUT 700 to determine which bias voltage 130 to provide to the conductive plates 160 of the PLM elements 615. Based on the value 705 from the LUT 700, the bias voltage determination circuit 510 generates a corresponding control signal 515 to the voltage regulator 520 to thereby cause the voltage regulator to generate the desired bias voltage 130.

FIG. 8 illustrates another example of a LUT 800 within the bias voltage determination circuit 510. In this example, a value 805 indicates the bias voltage for one of the colors such as red, and also specifies a delta voltage 810 through which the bias voltage for the other two colors can be calculated. The delta voltage 810 represents a change in bias voltage for a certain difference in wavelength. In the example of FIG. 8, the delta voltage is 0.1V and represents a change in bias voltage relative to the bias voltage for red of 0.1V for each (for example) 100 nanometers of change in wavelength. The bias voltage for green can be calculated as the bias voltage for red (0.1V in this example) plus the product 0.1V and the difference between the wavelength of green relative the wavelength of red. The bias voltage generator 120 implements the logic to use LUT 800 to determine the bias voltage for a given wavelength of light. The bias control signal 220 in this example indicates the wavelength.

In yet another example, the bias control signal 220 may include a single bit for red, a single bit for green, and a single bit for blue. The digital controller 605 sets the bit to a value, for example, '1' for the particular color being provided at that point in time, with the other two bits cleared to '0.'

In FIG. 6, the control voltages to the electrode 110 remain unchanged, but the bias voltage to each conductive plate depends on the color being represented at any point in time. Accordingly, the potential difference between the electrode 110 and the conductive plate 106 is the voltage on the electrode 110 minus the bias voltage applied to the conductive plate 106.

The displacement between the conductive plate 106 and the electrode 110 for a given electrode 110 voltage may be influenced by temperature of the PLM 610. That is, at higher temperatures for a given electrode voltage, the conductive plate 106 may fall nearer the electrode 110 thereby reducing the distance between the conductive plate and the electrode. FIG. 9 shows the use of a PLM 910 that implements temperature compensation. FIG. 9 shows the digital controller 605 coupled to PLM 910. The PLM 910 includes multiple PLM elements 615 as described above, a temperature sensor 920, a temperature scale circuit 930, and the bias voltage generator 120. The temperature sensor may be implemented as, for example, a temperature diode, a thermistor, or a resistor with a suitable large temperature coefficient to provide adequate signal-to-noise ratio. The temperature sensor 920 provides an analog temperature signal (TEMP) 925 to the temperature scale circuit 930.

Through testing, the amount of change in the distance between the conductive plate 106 and the electrode 110 due to temperature can be determined. For example, the PLM 910 can be placed in a thermal chamber and heated to different and controlled temperatures. Any of a variety of devices can be used to measure the initial displacement between electrode 110 and conductive plate 106 (e.g., the displacement with no applied voltage to electrode or conductive plate). Examples of such devices include laser Doppler vibrometers, and interferometers. From the temperature testing, a temperature coefficient for the PLM 910 can be determined in units of volts per degree Celsius. To determine a bias voltage for a particular temperature level, the temperature level would be multiplied by the temperature coefficient. The temperature scale circuit 930 scales and converts the analog temperature signal 925 to the bias control signal 220, which in this example is a digital signal. The scaling implemented by the temperature scale circuit 930 is a function of the temperature coefficient. In the example shown in FIG. 9, the temperature scale circuit 930 includes an amplifier 931, a LUT 932, and an analog-to-digital converter (ADC) 933. The amplifier 931 implements a gain programmable by the LUT 932. The temperature coefficient determined apriori for the PLM 910 is stored in the LUT 932. The temperature coefficient can be stored in other types of storage elements as well, such any type of read-only memory, electronic fuses, etc.

The temperature signal 925 is amplified by the amplifier 931 and thus scaled according to the temperature coefficient. The resulting scaled temperature signal 934 is converted to a digital representation by ADC 933 to thereby generate the bias control signal 220. The bias control signal 220 in this example is indicative of a bias voltage for the bias voltage generator 120 to generate based on a temperature reading from the temperature sensor 925.

In the example of FIG. 9, both the temperature sensor 920 and the temperature scale circuit 930 are provided on the same semiconductor die as the PLM elements 615. However, either or both of the temperature sensor 920 and the temperature scale circuit 930 can be implemented external to PLM 910 (i.e., on a separate die). In one embodiment, the temperature sensor 920 is implemented on the PLM's die, and the temperature scale circuit 930 is implemented on a separate die. In another embodiment, the temperature scale circuit 930 is implemented on the PLM's die, and the temperature sensor 920 is implemented on a separate die. In yet another embodiment, both the temperature sensor 920 and the temperature scale circuit 930 are implemented on a different die than the PLM 910 (either the temperature sensor 920 and the temperature scale circuit 930 are implemented on the same die or on separate dies).

Figure 10:
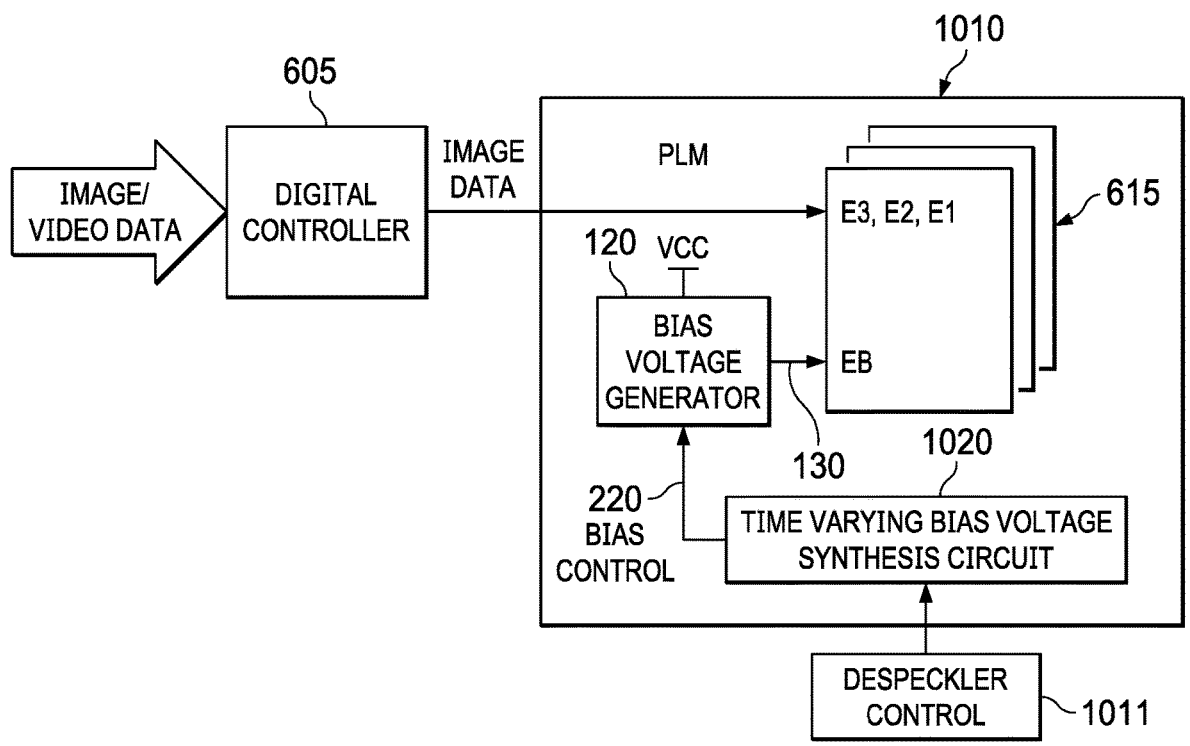
FIGS. 10-12 illustrate an example in which the bias voltage generator adjusts the bias voltage of the PLM for speckling control.

Speckling is a visual artifact that may result from a relatively narrow bandwidth of the laser used as the light source for a PLM. Speckling may result because of the use of a coherent light source (narrow bandwidth light source) with the light reflecting off of mirror 102 impinging on a surface that is not uniformly flat (e.g., has small perturbations across its surface). Speckling manifests itself as an image that appears grainy. FIG. 10 shows an example of a PLM 1010 that implements despeckling. A despeckler control signal 1011 may be an externally supplied control signal to the PLM 1010. The despeckler control signal 1011 commands the PLM 1010 to turn its despeckling capability on or off. The PLM 1010 in this example includes a time varying bias voltage synthesis circuit 1020 which generates the bias control signal 220. When despeckling is turned on (enabled), the time varying bias voltage synthesis circuit 1020 generates time varying bias control signal 220 to cause the bias voltage generator 120 to thereby generate time varying bias voltages 130. By varying (e.g., at a rate fast enough not to be perceptible by human vision) the bias voltage to the conductive plates 106 of the PLM elements 615, speckling is reduced or avoided altogether.

In one embodiment, the time varying bias voltage synthesis circuit 1020 is preprogrammed to output a sequence of bias control signals 220 that correspond to different voltages. In one example, the time varying bias voltage synthesis circuit 1020 includes a storage element (e.g., any suitable type of read only memory, LUT, etc.) that stores a sequence of values. The values are sequentially read from the storage element and provided to the bias voltage generator as a sequence of bias control signals 220.

Figure 11:
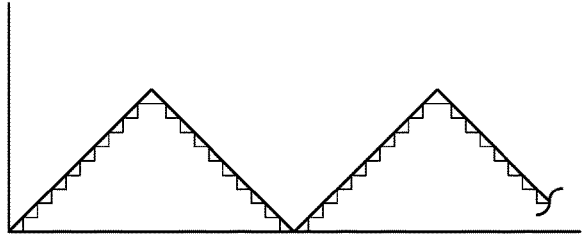

FIG. 11, for example, illustrates the sequence of values from the storage element of the time varying bias voltage synthesis circuit 1020 implementing a stair-step waveform that approximates a triangle wave. The bias voltage regulator 120 generates a bias voltage 130 corresponding to each time varying bias voltage synthesis circuit 1020 step of the triangle wave. In one such implementation, one complete cycle of the triangle wave values are stored in the storage element, and the sequence is repeated over and over to cause the bias voltage generator 120 to generate a sequence of correspondingly sized bias voltages 130. A clock operates the time varying bias voltage synthesis circuit 1020 to output the values from the storage element at a particular rate.

Figure 12:
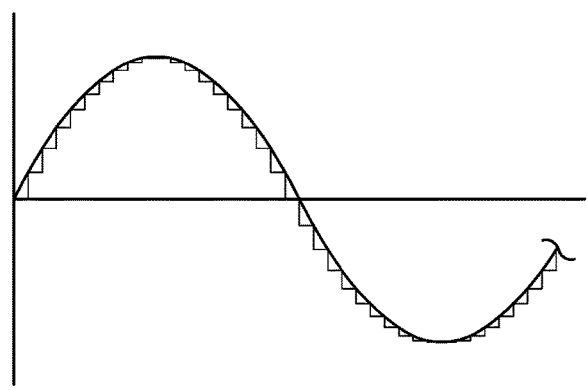

FIG. 12 illustrates a sequence of values from the storage element of the time varying bias voltage synthesis circuit 1020 that synthesizes a sinusoidal signal. The shape of the waveform can be any suitable time varying signal (triangle wave, sine wave, square wave, etc.).

At least some spatial light modulators operate on the basis of constructive and destructive interference and diffraction effects and thus depend upon using a coherent illumination source (e.g., laser). Therefore, if the wavelength of the illumination source changes, which can happen due to temperature, aging, or mode hopping, the ability of the spatial light modulator to display the desired content may be impaired. If the wavelength shifts lower, then bias voltage should be decreased, and if the wavelength shifts higher, then bias voltage should be increased.

Figure 13:
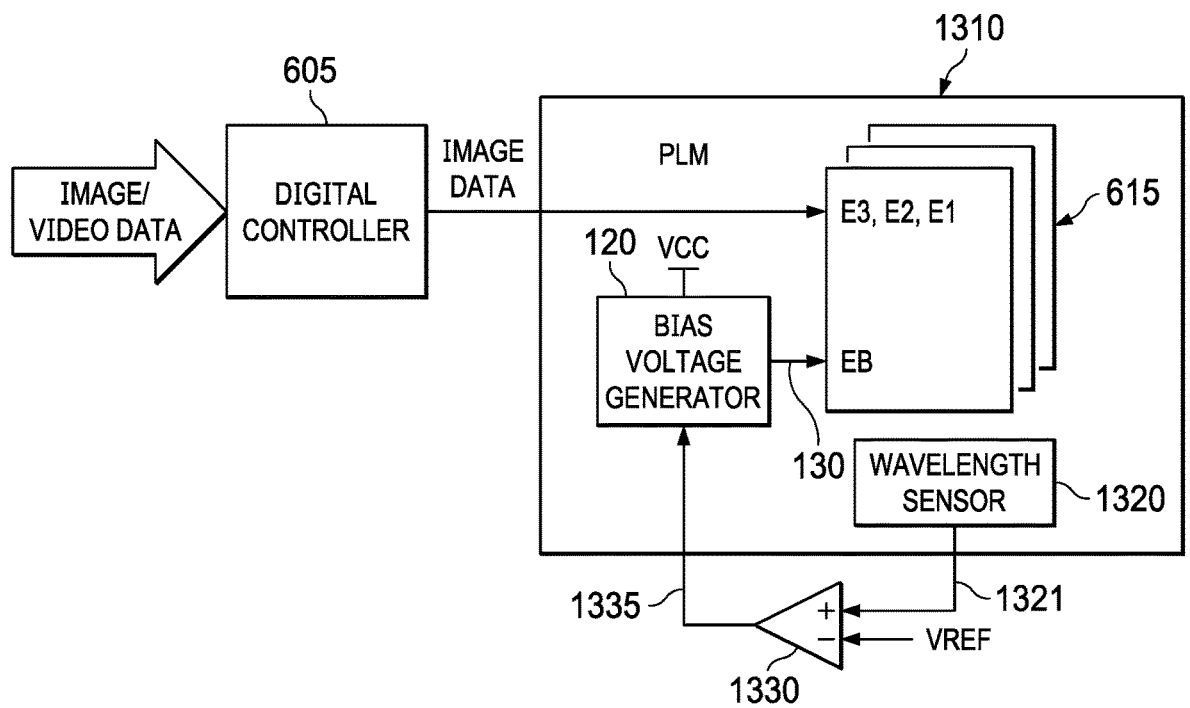
FIG. 13 illustrates an example in which the bias voltage generator adjusts the bias voltage of the PLM for laser drift compensation.

FIG. 13 shows an embodiment in which a PLM 1310 includes a wavelength sensor 1320 coupled to an amplifier 1330. The wavelength sensor 1320 may be any suitable sensor that produces an electrical signal responsive to the wavelength of light received on the sensor. In one example, the wavelengths sensor 1320 is a spectroradiometer. The amplifier 1330 receives the output signal 1321 from the wavelength sensor 1320 on one input, and a reference signal (VREF) on another input. The amplifier 1330 amplifies the difference between signal 1321 from the wavelength sensor 1320 and VREF. The output signal 1335 is a signal that indicates whether the signal 1321 is higher or lower than VREF and the magnitude of the difference. Responsive to the signal 1321, the bias voltage generator 120 produces the bias voltage 130 to account for changes in the wavelength of a light source (e.g., due to age of the light source).

In another implementation, the change in wavelength of the light source may be due to temperature changes of the light source. Accordingly, a temperature sensor may be coupled to or near the light source, and the temperature signal used by the bias voltage generator 120 to generate the bias voltage 130.

Figure 14:
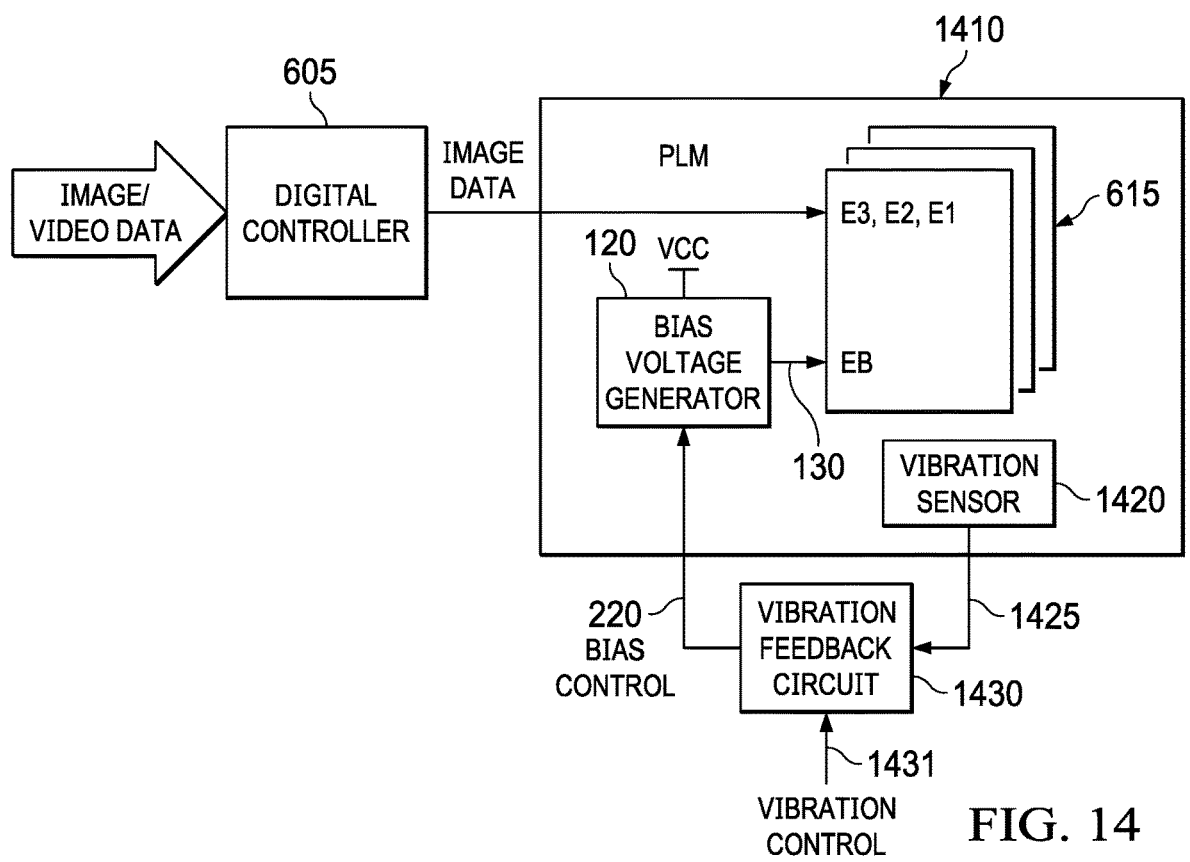
FIG. 14 illustrates an example in which the bias voltage generator adjusts the bias voltage of the PLM for vibration compensation.

If a phase light modulator is subject to mechanical vibration, the phase light modulator may undesirably cause a conjugate ghost image to be displayed. A conjugate ghost image is a copy of the desired image spatially shifted from the desired image and inverted. Vibration causes a change in the displacement of the conductive plate 106 relative the respective electrode 110, and thus the displacement of each mirror is not what is otherwise intended. As a result of unintended mirror displacements, conjugate images can be created. FIG. 14 shows an example of a PLM 1410 that includes a vibration sensor 1420 coupled to a vibration feedback circuit 1430. The vibration sensor 1420 may be an accelerometer or other type of sensor that outputs a signal responsive to mechanical vibration. The analog signal 1425 from the vibration sensor 1420 is provided to the vibration feedback circuit 1430. A vibration control signal 1431 enables or disables the vibration control feedback of the bias voltage 130. If vibration control is enabled (e.g., via the vibration control signal 1431), the vibration feedback circuit 1430 generates values for the bias control signal 220 that cause the bias voltage generator 120 to generate bias voltages to counteract the vibration to thereby reduce or eliminate any conjugate ghost images.

A voltage signal in phase with the vibration experienced by the PLM may be inverted and provided back into the PLM. In some implementations, the base resonance of the PLM may be higher than that of the mechanical vibrations sensed by the accelerometer. Accordingly, the vibration feedback circuit 1430 may implement an application-specific transfer function based on the anticipated mechanical oscillation expected by the PLM at a certain frequency.

As described above, the phase light modulator includes a conductive plate 106 that moves vertically with respect to the electrode 110 responsive to an applied potential difference. The separation distance between the conductive plate 106 and the electrode 110 (identified as D2 in FIG. 3) is nominally a function of the potential difference. Referring briefly to FIG. 1, the height of the support post 108 is D1. Due to manufacturing tolerances, the height of the support posts 108 can vary from device to device. For example, D1 may be 5 nm with a tolerance of +/−1 nm. That is, D1 may be in the range of 4 nm to 6 nm across a sampling of devices. The separation D2 thus is a function of both (a) the potential difference between the conductive plate 106 and the electrode 110 and (b) the height D1 of the support posts 108. Accordingly, unfortunately the separate D2 for a given potential difference can vary from device to device according to the manufacturing tolerance of the height of the support posts 108.

Electrostatic actuators have a "pull-in" voltage, which is the potential difference between electrode 110 and conductive plate 106 to cause the mirror 102 to be separated by a distance from the electrode 110, which is equal to one-half the wavelength of the respective wavelength received reflected by the mirror.

The pull-in point (one-half wavelength separation between mirror 102 and electrode 110) is a function, in part, of the height D1 of the support posts 108. Accordingly, for different height support posts 108, the pull-in voltage will be different. FIG. 15 shows an example in which the PLM 1510 applies a bias voltage to the conductive plates 106 of the PLM elements 615 to calibrate for tolerances of the support posts 108. In this example, the PLM 1510 includes a storage device 1520 in which binning information is stored. FIG. 16 shows an example of binning information in the form of a LUT 1525. For each of different pull-in voltages 1610, the binning information includes a particular bias voltage 1620. In this example, the pull-in voltage for a given PLM 1510 is used as a proxy value for the height D1 of the support posts 108. For a larger D1, the pull-in voltage will be higher, and for a smaller D1, the pull-in voltage will be lower. Through testing, a bias voltage can be determined for each of the various pull-in voltages within the binning information. The binning information is stored in storage device 1520. For a specific PLM device, the pull-in voltage can be measured, for example, using a laser Doppler or vibrometer.

The light source(s) for a PLM have a bandwidth that is relatively narrow, relatively wide, or somewhere in between. A laser diode, for example, has a relatively narrow bandwidth. Other light sources such as light emitting diodes, have bandwidths that are wider than lasers. In general, a PLM is tuned to a particular wavelength of light. FIG. 17A illustrates an example of the wavelengths 1701 produced by a light source for a PLM that is tuned to one particular wavelength 1705. If the light source includes that particular wavelength and other wavelengths due its wider bandwidth, a visual smearing effect may be noticed from using a wider bandwidth light source.

Figure 17B:
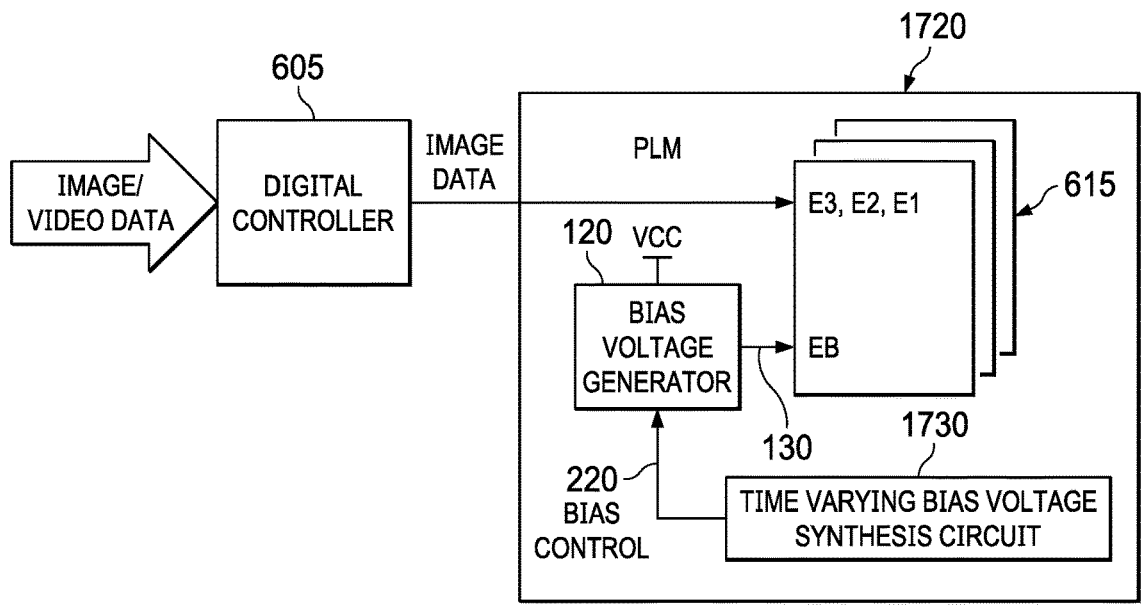

FIG. 17B is directed to an embodiment of a PLM 1720 in which the bias voltage for the support posts is modulated across approximately the full bandwidth of the light source so that the PLM is tuned to the various wavelengths of the light source. The PLM 1720 includes a time varying bias voltage synthesis circuit 1730 (implemented the same or similar to the time varying bias voltage synthesis circuit 1020 of FIG. 12). The time varying bias voltage synthesis circuit 1720 produces the bias control signal 220 to the bias voltage generator 120 such that the bias voltage generator 120 produces a time varying bias voltage to the PLM elements 615 to tune the PLM to various wavelengths within some or all of the light source's bandwidth. In one example, the time varying bias voltage synthesis circuit 1730 causes the bias voltage generator 120 to sweep its bias voltage output at a rate that is faster than the human eye could detect (e.g., 100 to 360 Hz)

Figure 18A:
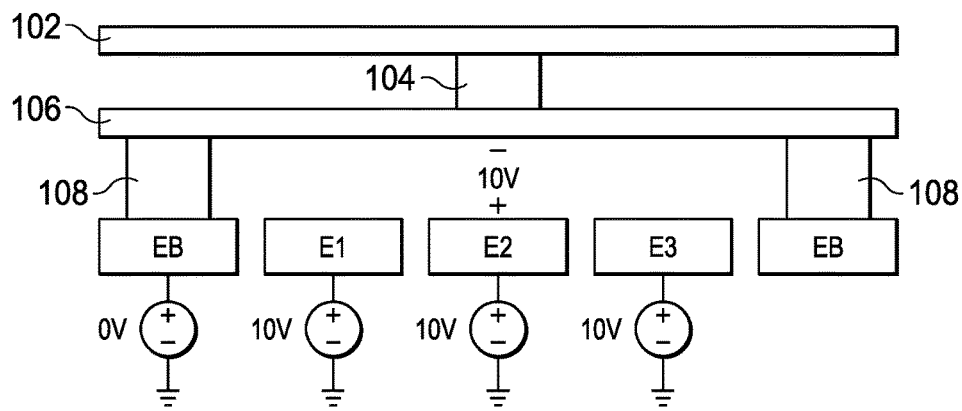
FIGS. 18A-18C illustrates an example in which the bias voltage generator adjusts the bias voltage of the PLM for charge mitigation.
Figure 18B:
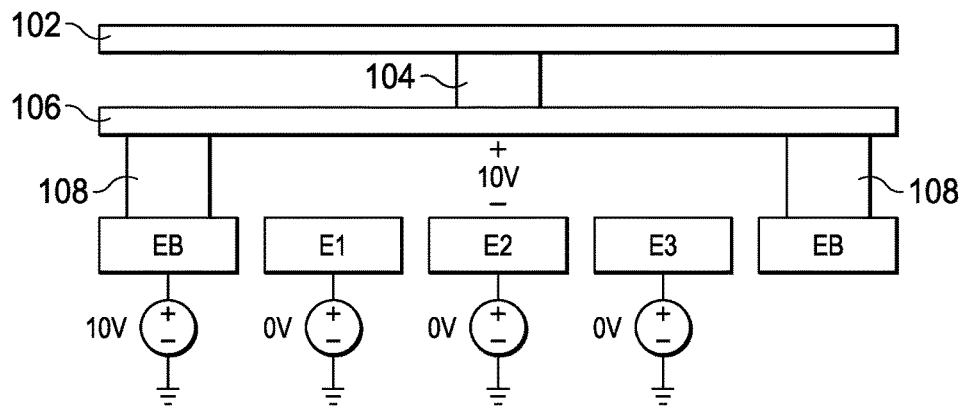
Figure 18C:
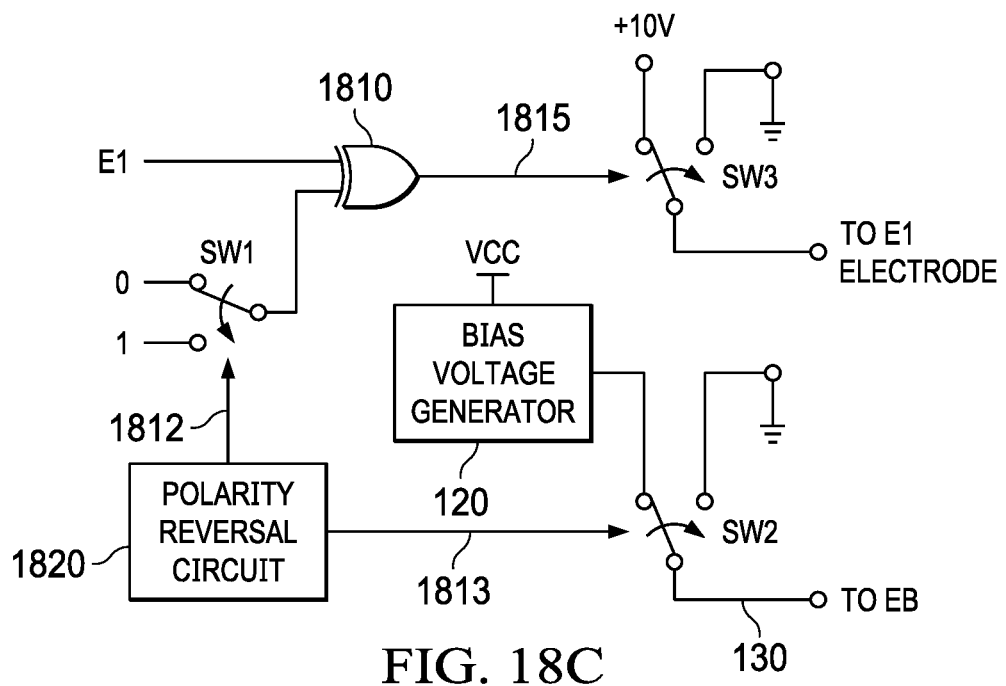

Water vapor may exist in or around the PLM elements. The dipole moment of water on the electrode surface may result in the formation of charge on the surface of the electrode (E1, E2, E3). FIGS. 18A-18C are directed to an embodiment to reduce or eliminate the charge that may otherwise form from water on the surface of an electrode. In this embodiment, the water-based charge is mitigated by reversing the polarity of the potential difference between the electrode 110 and the conductive plate 106. FIG. 18A illustrates the state of the potential difference with +10V applied to E1-E3 and a bias voltage of 0V applied to the support posts and conductive plate 106. FIG. 18B illustrates the reversal of the potential difference with 0V applied to E1-E3 and a bias voltage of 10V applied to the support posts and conductive plate 106. In FIG. 18A, the potential difference from the electrodes E1-E3 to the conductive plate 106 is +10V, and in FIG. 18B, the potential difference from the electrodes E1-E3 to the conductive plate 106 is −10V. By reversing the potential difference, the dipole moment of water on the electrode surface is varied (e.g., pseudo randomized) and charge is reduced or eliminated on the surface of the electrode due to water.

FIG. 18C shows an example implementation in which each electrode bit (E1 is shown in FIG. 18C) is provided to an input of an exclusive-OR (XOR) gate 1810. Another input of XOR gate 1810 receives either a logic 0 or a logic 1 from switch SW1 based on a control signal 1812 from a polarity reversal circuit 1820. The logic state of E1 is flipped (0 becomes 1, and vice versa) upon XORing E1 with a logic 1. Otherwise, XOR'ing E1 with a 0 maintains the logic state of E1 unchanged. The output signal 1815 from XOR gate 1810 is used as control signal to switch SW3, which provides either 0V or the electrode voltage (e.g., +10V) to the E1 electrode of each PLM element 615. In one implementation, E1 being a 1 may be intended to cause +10V to be applied to the electrode, whereas E1 being a 0 may be intended to cause 0V to be applied to the electrode. By flipping the logic state of E1, E1 being a 1 may instead cause 0V to be applied to the electrode, and E1 being a 0 may cause +10V to be applied to the electrode. SW2 is used to also cause a polarity reversal for the bias voltage. A control signal 1813 (which may be control signal 1812 or a separate control signal) from the polarity reversal circuit 1820 causes the bias voltage to the support posts 108 to change polarity.

Accordingly, the polarity reversal circuit 1820 generates control signals 1812 and 1813 to flip the polarity of potential difference between the electrode 110 and the conductive plate 106. The polarity reversal circuit 1820 may implement a duty cycle for the control signals 1812 and 1813 and thus a duty cycle for polarity reversal of the potential difference between the electrode 110 and the conductive plate 106. In one example, the duty cycle is 50%, but can be other than 50% in other examples.

Figure 19:
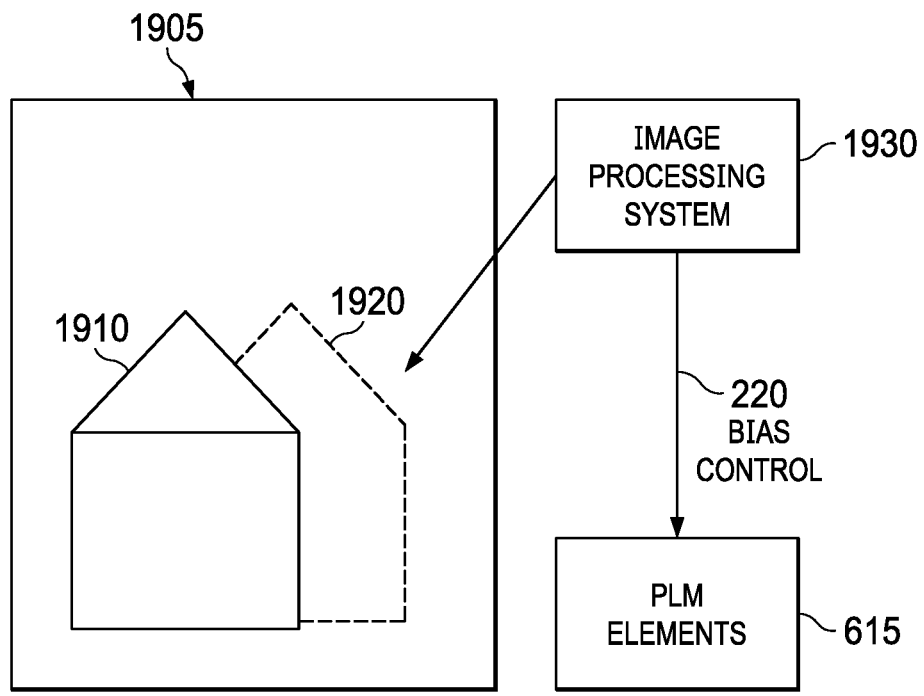
FIG. 19 illustrates an example in which the bias voltage generator adjusts the bias voltage of the PLM for conjugate ghost image control.

If the spacing between the mirror 102 and the electrode 110 is not precisely controlled, a conjugate ghost image may exist in the resulting image created by the PLM. Conjugate ghost images are described above. FIG. 19 shows an example of an image 1905 containing an intended image 1910 and a conjugate ghost image 1920. Image 1910 should be displayed, but not conjugate ghost image 1920. The example of FIG. 19 includes an image processing system 1930 which processes the image 1905 to determine whether a conjugate ghost image exists. In one example, the image processing system 1930 analyzes a portion of image 1905 where an intended image should not exist. This analysis can be performed by comparing the light magnitude of the image detected in the portion of the image 1905 with a threshold value (below the threshold value, no image (conjugate ghost or otherwise) is determined to exists, and above the threshold, a conjugate ghost image is determined to exist by the image processing system 1930). Responsive to the image processing system 1930 determining that a conjugate ghost image exists, the image processing system 1930 generates a bias control signal 220 to the PLM elements 615 to change the bias voltage to the conductive plate 106. The image processing system 1930 continues analyzing image 1905 after causing the bias voltage to change. If a conjugate ghost image is still detected, the image processing changes the value of the bias control signal 220 to again change the bias voltage. This process repeats until the image processing system 1930 no longer detects a conjugate ghost image. The image processing system 1930 may be separate from the PLM or may be integrated on the PLM (e.g., an image processing circuit on the PLM with an input that can be connected to an external camera).

Figure 20:
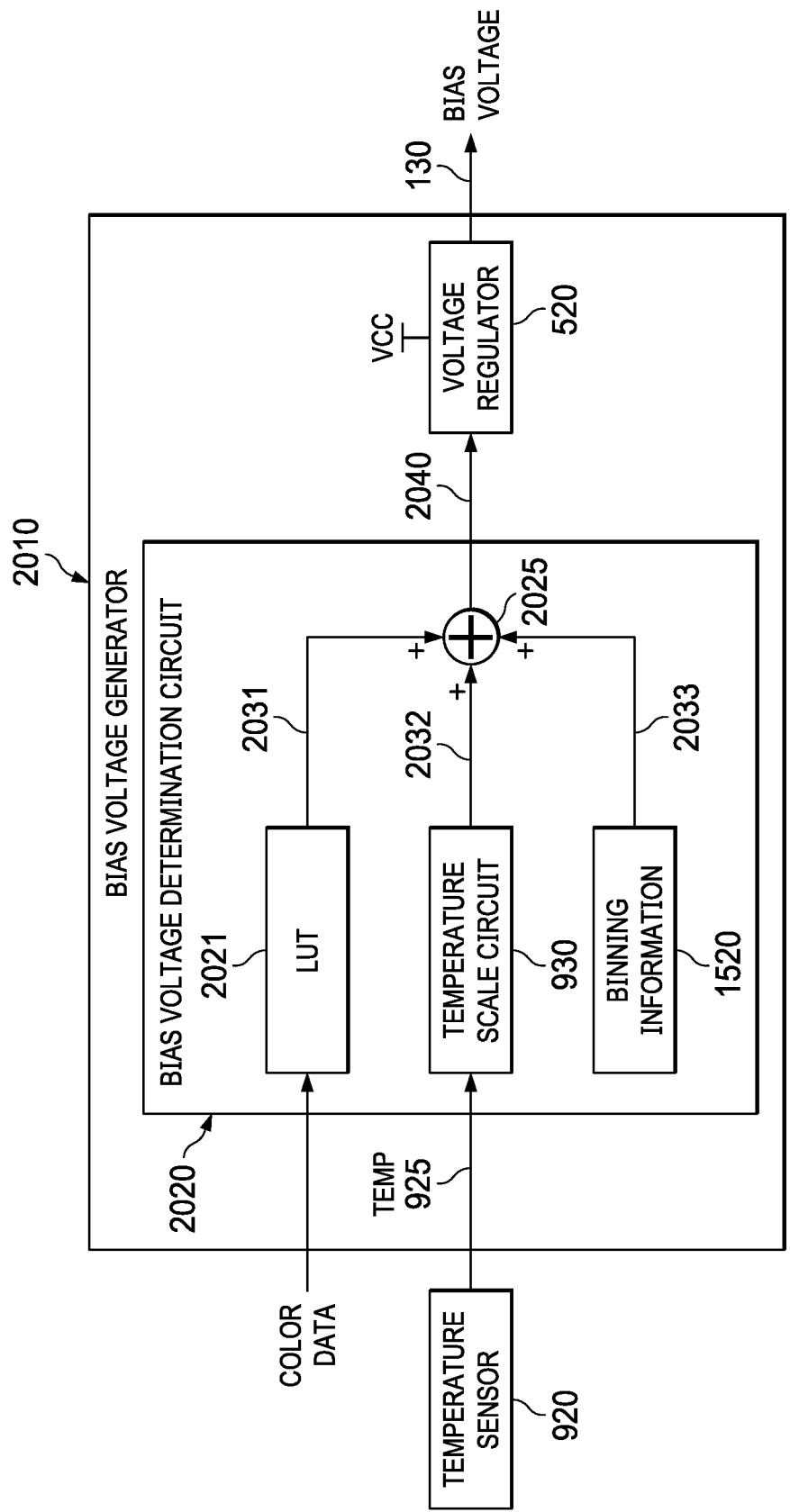
FIG. 20 illustrates the generation of a bias voltage based on multiple factors.

Any of the aforementioned examples for feedback control of the bias voltage 130 for the conductive plate 106 of each PLM element 615 can be combined with any other example. That is, two or more of the aforementioned examples can be implemented in concert on the same PLM. FIG. 20 shows an example of a bias voltage generator 2010 usable for a PLM in which a bias voltage 130 is generated based on color data, temperature, and binning information. The bias voltage generator 2010 includes a bias voltage determination circuit 2020 and a voltage regulator 520. Voltage regulator 520 may be implemented as described above.

The illustrative bias voltage determination circuit 200 includes a LUT 2021, temperature scale circuit 930, and storage device 1520 which contains the binning information. The outputs of LUT 2021, temperature scale circuit 930, and storage device 1520 are coupled to inputs of an adder 2025, the output of which is coupled to the voltage regulator 520. The color data is a value indicative of which color is being shined on the PLM elements 615. Examples of various ways to represent color are described above. The color data is used as a look-up into the LUT 2021 to provide a value 2031 indicative of the bias voltage corresponding to the color. The value 2031 is provided to the adder 2025. The temperature signal (TEMP) 925 from temperature sensor 920 is provided to the temperature scale circuit 930 which produces a temperature-based control signal 2032 (equivalent to the bias control signal 220 of FIG. 9) to the adder 2025. Binning information also is used to provide a control signal 2033 (equivalent to the bias control signal 220 of FIG. 15) to the adder 2025.

The adder 2025 adds together the various input signals 2031-2032 to produce a signal 2040 to the voltage regulator 520. As described above, the signal 2040 may control the duty cycle implemented by the PWM controller of the voltage regulator. The voltage regulator 520 produces a regulated bias voltage 130 based on the signal 2040 from the bias voltage determination circuit 2020, and the signal 2040 is a function of, in this example, color, temperature, and binning information.

Although color, temperature, and binning information are combined to produce a bias voltage 130 for the conductive plates 106 of the PLM elements 615, any two or more of the aforementioned factors can be combined together in a similar manner in other implementations.

The term "couple" is used throughout the specification. The term may cover connections, communications, or signal paths that enable a functional relationship consistent with the description of the present disclosure. For example, if device A generates a signal to control device B to perform an action, then: (a) in a first example, device A is directly coupled to device B; or (b) in a second example, device A is indirectly coupled to device B through intervening component C if intervening component C does not substantially alter the functional relationship between device A and device B, such that device B is controlled by device A via the control signal generated by device A.

Modifications are possible in the described embodiments, and other embodiments are possible, within the scope of the claims.

What is claimed is:

1. An apparatus comprising:
   a controller;
   a micro-electromechanical system (MEMS) mirror structure having an electrode, a conductive plate, and a reflective layer coupled to the conductive plate, the electrode coupled to the controller, and the conductive plate configured to move vertically with respect to the electrode responsive to a voltage generated by the controller and applied to the electrode;
   a sensor configured to measure a wavelength of light impinging the MEMS mirror structure;
   a feedback circuit coupled to the sensor, the feedback circuit configured to produce a bias control signal based on the wavelength of light impinging on the MEMS mirror structure; and
   a bias voltage generator coupled to the conductive plate and to the feedback circuit, the bias voltage generator having an input configured to receive the bias control signal, the bias voltage generator configured to apply a non-zero bias voltage to the conductive plate responsive to the bias control signal.

2. The apparatus of claim 1, wherein the feedback circuit comprises an amplifier, and the bias voltage generator includes a look-up table (LUT) that stores a value indicative of a bias voltage for a given wavelength of light.

3. The apparatus of claim 1, further comprising a temperature sensor and a temperature scale circuit coupled to the temperature sensor and to the bias voltage generator.

4. The apparatus of claim 3, wherein the temperature scale circuit comprises:
   a memory comprising a look-up-table (LUT);

an amplifier having an amplifier input, an amplifier control input, and an amplifier output, the amplifier input coupled to the temperature sensor and the amplifier control input coupled to the memory; and an analog-to-digital converter (ADC) having an ADC input and an ADC output, the ADC input coupled to the amplifier output and the ADC output coupled to the bias voltage generator.

5. The apparatus of claim 1, wherein the non-zero bias voltage is a time varying bias voltage, and the apparatus further includes a time varying bias voltage synthesis circuit having a control input, wherein the time varying bias voltage synthesis circuit is configured to a produce the time varying bias voltage responsive to a particular signal on its control input.

6. The apparatus of claim 1, wherein the non-zero bias voltage is a function of drift of wavelength of a light source.

7. The apparatus of claim 1, further comprising:
a vibration sensor; and
a vibration feedback circuit coupled to the vibration sensor and to the bias voltage generator.

8. The apparatus of claim 1, further comprising:
a storage element in which first and second values indicative of first and second non-zero bias voltages are stored, the first and second non-zero bias voltages corresponding to different pull-in voltages; and
an adder coupled to the storage element and to the feedback circuit, the adder having a first input, a second input, and an output, the first input coupled to the storage element, the second input coupled to the feedback circuit, and the output coupled to the bias voltage generator.

9. The apparatus of claim 1, further including a time varying bias voltage synthesis circuit having an output coupled to an input of the bias voltage generator, the time varying bias voltage synthesis circuit configured to generate the bias control signal to the bias voltage generator to cause the bias voltage generator to generate different non-zero bias voltages.

10. The apparatus of claim 1, further including a polarity reversal circuit configured to reverse a polarity of a potential difference between the electrode and the conductive plate.

11. The apparatus of claim 1, wherein the MEMS mirror structure comprises a phase light modulator.

12. An apparatus comprising:
a micro-electromechanical system (MEMS) structure having an electrode, a conductive plate, and a reflective layer on the conductive plate;
a storage element;
a bias voltage circuit coupled to the storage element, the bias voltage circuit configured to produce a time varying bias control signal based on sequentially reading a sequence of values from the storage element; and
a bias voltage generator coupled to the conductive plate and to the bias voltage circuit, the bias voltage generator having an input configured to receive the time varying bias control signal, the bias voltage generator configured to apply a time varying bias voltage to the conductive plate responsive to the time varying bias control signal,
wherein the conductive plate is configured to move with respect to the electrode responsive to a potential difference between the electrode and the conductive plate.

13. The apparatus of claim 12, further including a polarity reversal circuit configured to reverse a polarity of the potential difference between the electrode and the conductive plate.

14. The apparatus of claim 12, further comprising a despeckler control circuit coupled to the bias voltage circuit.

15. The apparatus of claim 12, wherein the time varying bias control signal is a triangular signal or a sinusoidal signal.

16. The apparatus of claim 12, wherein the bias voltage circuit is configured to tune the MEMS structure to wavelengths of light impinging the MEMS structure.

17. A apparatus comprising:
a micro-electromechanical system (MEMS) mirror structure having an electrode, a conductive plate, and a reflective layer on the conductive plate, the conductive plate configured to move based on a potential difference between the electrode and the conductive plate;
memory configured to store binning information indicating a pull-in voltage for the MEMS mirror structure, the memory configured to produce a bias control signal based on a pull-in voltage of the MEMS mirror structure; and
a bias voltage generator coupled to the conductive plate and to the memory, the bias voltage generator having an input configured to receive the bias control signal, the bias voltage generator configured to apply a time varying bias voltage to the conductive plate responsive to the bias control signal.

18. The apparatus of claim 17, further comprising:
a look-up table (LUT) configured to produce an output signal at a LUT output based on receiving color data; and
an adder having a first adder input, a second adder input, and an adder output, the first adder input coupled to the LUT output, the second adder input coupled to the memory, and the adder output coupled to the bias voltage generator.

19. The apparatus of claim 17, further comprising:
a temperature scale circuit adapted to be coupled to a temperature sensor; and
an adder having a first adder input, a second adder input, and an adder output, the first adder input coupled to the temperature scale circuit, the second adder input coupled to the memory, and the adder output coupled to the bias voltage generator.

* * * * *